United States Patent [19]

Merchant

[11] Patent Number: 5,710,451
[45] Date of Patent: Jan. 20, 1998

[54] HIGH-VOLTAGE LATERAL MOSFET SOI DEVICE HAVING A SEMICONDUCTOR LINKUP REGION

[75] Inventor: Steven L. Merchant, Phoenix, Ariz.

[73] Assignee: Philips Electronics North America Corporation, New York, N.Y.

[21] Appl. No.: 629,819

[22] Filed: Apr. 10, 1996

[51] Int. Cl.$^6$ .......................... H01L 29/74; H01L 31/111; H01L 27/01; H01L 27/12
[52] U.S. Cl. ......................... 257/347; 257/140; 257/141
[58] Field of Search ............................ 257/347, 141, 257/140, 409, 143, 145, 168, 349; 437/41, 40, 6

[56] References Cited

U.S. PATENT DOCUMENTS

| | | | |
|---|---|---|---|
| 5,068,700 | 11/1991 | Yamaguchi et al. | 257/141 |
| 5,138,409 | 8/1992 | Kawai | 357/23.4 |
| 5,202,573 | 4/1993 | Shirai | 257/141 |
| 5,240,865 | 8/1993 | Malhi | 437/6 |
| 5,246,870 | 9/1993 | Merchant | 437/21 |
| 5,300,448 | 4/1994 | Merchant et al. | 437/41 |
| 5,362,979 | 11/1994 | Merchant | 257/340 |
| 5,412,241 | 5/1995 | Merchant | 257/409 |
| 5,554,546 | 9/1996 | Malhi | 437/40 |
| 5,633,525 | 5/1997 | Kitamura et al. | 257/141 |

FOREIGN PATENT DOCUMENTS

4326846A1   4/1994   Germany ................ H01L 29/784

*Primary Examiner*—Stuart S. Levy
*Assistant Examiner*—Adriana Giordana
*Attorney, Agent, or Firm*—Steven R. Biren

[57] ABSTRACT

A Semiconductor-On-Insulator (SOI) device includes a semiconductor substrate, a buried insulating layer on the substrate, and a lateral MOSFET on the buried insulating layer. The MOSFET includes a semiconductor surface layer on the buried insulating layer and has a source region of a first conductivity type, a channel region of a second conductivity type opposite to that of the first, an insulated gate electrode over the channel region and insulated therefrom, a lateral drift region of the second conductivity type, and a drain region of the first conductivity type laterally spaced apart from the channel region by the drift region. A semiconductor linkup region of the first conductivity type is provided between the channel region and the drift region and extends substantially through the semiconductor surface layer, and the source region of the device is electrically coupled to the drift region. This device configuration is particularly useful in providing a high-voltage p-channel MOS transistor using thin SOI high-voltage technology normally associated with fabricating n-channel devices.

8 Claims, 1 Drawing Sheet

HIGH-VOLTAGE LATERAL MOSFET SOI DEVICE HAVING A SEMICONDUCTOR LINKUP REGION

BACKGROUND OF THE INVENTION

The invention is in the field of Semiconductor-On-Insulator (SOI) devices, and relates specifically to lateral SOI devices suitable for high-voltage applications.

In fabricating high-voltage power devices, tradeoffs and compromises must typically be made in areas such as breakdown voltage, size, "on" resistance and manufacturing simplicity and reliability. Frequently, improving one parameter, such as breakdown voltage, will result in the degradation of another parameter, such as "on" resistance. Ideally, such devices would feature superior characteristics in all areas, with a minimum of operational and fabrication drawbacks.

One particularly advantageous form of SOI device includes a semiconductor substrate, a buried insulating layer on the substrate, and a lateral MOSFET on the buried insulating layer, the MOSFET including a semiconductor surface layer on the buried insulating layer and having a source region of a first conductivity type, a channel region of a second conductivity type opposite to that of the first, an insulated gate electrode over the channel region and insulated therefrom, a lateral drift region of the second conductivity type, and a drain region of the first conductivity type laterally spaced apart from the channel region by the drift region.

A device of this type is shown in FIG. 1 common to related U.S. Pat. No. 5,246,870 (directed to a method) and U.S. Pat. No. 5,412,241 (directed to a device) of the present inventor. The device shown in FIG. 1 of the aforementioned patents is a lateral SOI MOSFET device having various features, such as a thinned SOI layer with a linear lateral doping region and an overlying field plate, to enhance operation. As is conventional, this device is an n-channel or NMOS transistor, with n-type source and drain regions, manufactured using a process conventionally referred to as NMOS technology.

However, for full flexibility in circuit implementation, it would desirable to fabricate both NMOS and PMOS transistors having similar, high breakdown voltages using a single technology (e.g. NMOS technology using an n-type SOI layer).

One approach for realizing a high-voltage PMOS transistor in a thin SOI film is to use a structural configuration as described above and simply reverse the conductivity type of all semiconductor regions. The problem with this approach is that a supply voltage of opposite polarity (i.e. negative relative to the substrate) is then required to deplete the p-type linearly graded drift region during reverse blocking. For many circuit applications, the use of both positive and negative high-voltage power supplies is either unsuitable or uneconomical, and so it would be desirable to have a high-voltage PMOS transistor capable of blocking a high positive voltage with respect to the substrate.

Another approach, involving the fabrication of a conventional PMOS transistor by providing a shallow p-type implant on the top surface of the device and using a relatively thick drift region also does not provide an entirely satisfactory solution, since such a structure would not provide a sufficiently high breakdown voltage to match the capability of commonly-fabricated NMOS transistors, and would thus unduly limit the permissible operating voltage of the circuit.

Accordingly, it would be desirable to have a lateral MOSFET SOI device configuration which would permit the flexible implementation of both NMOS and PMOS high-voltage transistors using a single (typically NMOS) technology. Additionally, it would be desirable to have an SOI MOSFET device configuration that permits the use of a single polarity high-voltage power supply for powering both NMOS and PMOS devices, and in which the breakdown voltage of both types of devices is approximately the same.

SUMMARY OF THE INVENTION

It is therefore an object of the invention to provide a high-voltage PMOS transistor capable of blocking a high positive voltage with respect to the substrate. It is a further object of the invention to provide a lateral MOSFET SOI device configuration which will permit the flexible implementation of both NMOS and PMOS high-voltage transistors using a single (typically NMOS) technology.

In accordance with the invention, these objects are achieved in an SOI MOSFET device of the type described above in which a semiconductor linkup region of the first conductivity type is provided between the channel region and the drift region and extends substantially through the semiconductor surface layer, and in which the source region is electrically coupled to the drift region. Typically, the device will be a PMOS transistor, provided in an SOI layer which may also contain one or more NMOS devices.

In a preferred embodiment of the invention, the linkup region extends from an upper surface of the semiconductor surface layer down to the buried insulating layer.

In a further preferred embodiment of the invention, a buffer region of the second conductivity type and having a higher doping concentration than that of the drift region is provided between the linkup region and the drift region.

SOI devices in accordance with the present invention offer a significant improvement in that both PMOS and NMOS transistors can be fabricated in a high-voltage SOI structure using only a single (typically NMOS) technology. Furthermore, in devices in accordance with the present invention, the PMOS and NMOS transistors will have high and approximately equal breakdown voltages, and it will not be necessary to use a dual-polarity power supply or to employ shallow p-type diffusion regions to implement the PMOS transistors.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1:
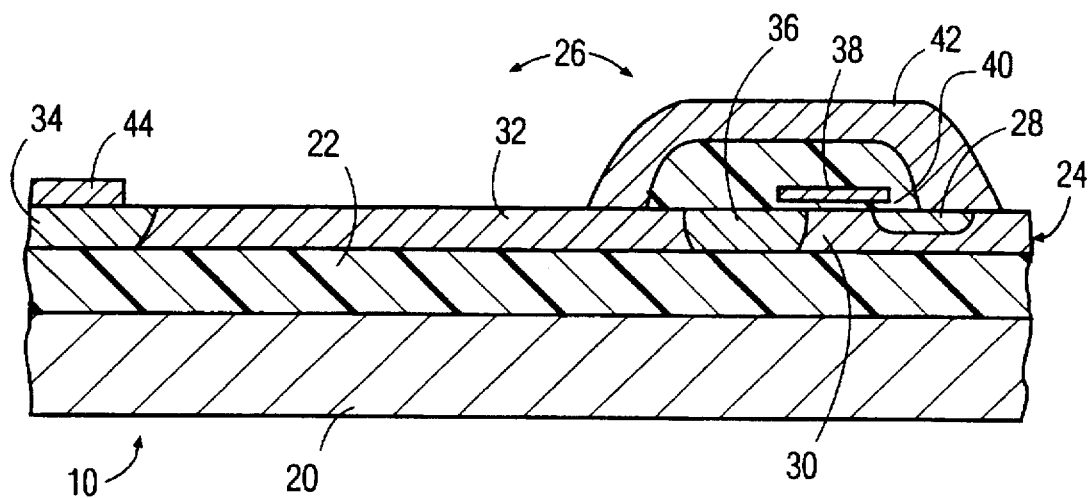
FIG. 1 shows a cross-sectional view of a first embodiment of an SOI device in accordance with the invention.

In the drawing, semiconductor regions having the same conductivity type are generally shown hatched in the same direction, and it should be noted that the figures are not drawn to scale.

DESCRIPTION OF THE PREFERRED EMBODIMENTS

An SOI device 10 in accordance with the invention is shown in simplified form for purposes of illustration in FIG.

1. The device includes a semiconductor substrate 20 of either n-type or p-type conductivity and of any desired doping level. A buried insulating layer 22, typically of silicon oxide and having a thickness in the range of about 0.5–4 microns is provided on the substrate 20, and a semiconductor surface layer 24 is provided on the buried insulating layer 22. The semiconductor surface layer contains a lateral PMOS MOSFET device 26 having a source region 28, a channel region 30, a lateral drift region 32 and a drain region 34. In accordance with the invention, the semiconductor surface layer 24 also includes a semiconductor linkup region 36, the composition and function of which will be explained in further detail below. The basic structure of the device is completed by an insulated gate electrode 38, which is insulated from the semiconductor surface layer 24 by an oxide insulation region 40, with a source electrode 42 which contacts source region 28 and region 30 and extends over oxide 40 to also contact the lateral drift region 32 adjacent the linkup region 36, and an electrode 44 for contacting the drain region 34.

In the device shown in FIG. 1, the semiconductor surface layer 24 may typically have a thickness in the range of 0.2 to 2 microns, with the portion of this layer forming the channel region 30 being of an n-type conductivity with a doping level of about $10^{16}$–$10^{17}$ cm$^{-3}$, and with the drift region 32 also being n-type and having a dose in the range of $10^{12}$–$10^{13}$ cm$^{-2}$, with either a constant or linearly-graded doping profile and a length in the range of 20 to 70 microns.

Figure 2:
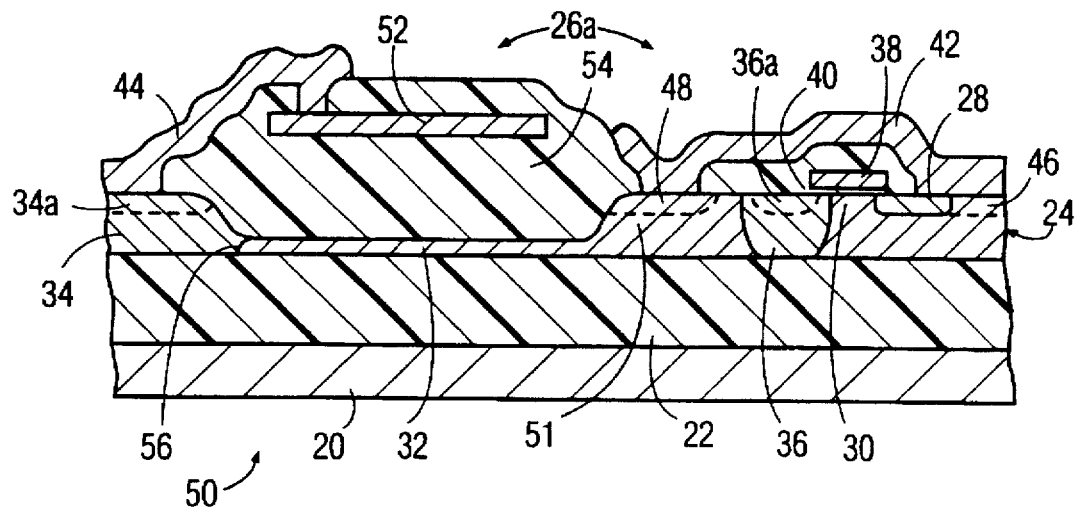
FIG. 2 shows a cross-sectional view of a second embodiment of an SOI device in accordance with the invention.

The source region 28 and drain region 34 are of p-type conductivity and have a doping level of about $10^{19}$ cm$^{-3}$ or greater, at least at the surface, to ensure good ohmic contact. Similarly, n-type conductivity portions of the semiconductor surface layer will, in a practical device, have a doping level of about $10^{19}$ cm$^{-3}$ or greater at the areas where contact is made with the source electrode 42, a feature which is shown in FIG. 2 but eliminated from the simplified depiction of FIG. 1 for improved clarity. The linkup region 36 is of p-type conductivity and can have a doping level of about $10^{15}$ cm$^{-3}$ or greater. Since the insulated gate electrode (38), oxide insulation region (40) and source and drain electrodes (42, 44) are of conventional construction well known to those of ordinary skill in the art, they are not described further herein. Additionally, it should be noted that the various doping levels and thicknesses provided herein are merely exemplary, and that the invention is not limited to the values provided.

A more detailed embodiment of the invention is shown in FIG. 2. With reference to this embodiment, it will be recognized that many of the structural features shown therein are similar to those of the devices shown in my earlier U.S. Pat. Nos. 5,246,870 and 5,412,241, and in the interest of brevity, those patents are incorporated herein by reference in their entirety inter alia for the purpose of disclosing and defining various structural details which are common to the structures disclosed therein and the structures of the present invention. Additionally, it is noted that, for simplicity, like regions in FIGS. 1 and 2 have been designated with like reference numerals, and will be described only insofar as they differ from the regions as shown and described in connection with FIG. 1.

In the lateral PMOS MOSFET device 26a of SOI device 50 shown in FIG. 2, semiconductor surface layer 24 is provided on buried insulating layer 22 on semiconductor substrate 20, as in FIG. 1, but in this device the lateral drift region 32 is provided in a thinned portion of the semiconductor surface 24, in a matter analogous to that shown in my prior patents referenced above. The drift region 32 here may be from about 0.2 up to about 2 microns and may have a dose of about $10^{12}$–$10^{13}$ cm$^{-2}$, with either a constant doping level throughout, or else a linearly-graded doping level as described in the previously-cited patents.

Additional structural features of the MOSFET device 26a shown in FIG. 2 are the n-type conductivity surface contact regions 46 and 48, having a high doping level typically on the order of $10^{19}$ cm$^{-3}$ or greater, which are provided for the purpose of providing a good ohmic contact with source electrode 42, and a p-type conductivity region 34a at the surface of the drain region 34, with this region also having a high doping concentration in the range of $10^{19}$ cm$^{-3}$ or greater to ensure good ohmic contact to drain electrode 44. The drain region 34 can then have a lower doping level of about $10^{15}$ cm$^{-3}$ or greater. Additionally, the doping in a buffer region 51 between the linkup region 36 and the drift region 32 is n-type conductivity at doping level of about $10^{15}$ cm$^{-3}$ or greater, and the linkup region 36 may be provided with one or more surface regions 36a having a higher doping level than that of the of the remainder of the linkup region. A typical doping level for the surface region (s) 36a would be about $10^{19}$ cm$^{-3}$.

Additionally, the device of FIG. 2 is provided with a field plate 52 over the drift region 32 and separated therefrom by a field oxide 54 which may have a thickness in the same range as that of the buried oxide 22, namely 0.5–4 microns. The field oxide 54 may be formed by a LOCOS technique, which will also serve to thin the drift region 32. The field plate, which may be of suitably-doped polysilicon or other material, is connected to the surface region 34a of the drain region 34 by drain electrode 44. For further details regarding field plates, thinned drift regions, and the like, reference is made to the U.S. patents cited above.

In order to better understand the advantages afforded by the present invention, operation of the device shown in FIG. 2 in both the off and on states will be explained. The basic circuit application of the device of FIG. 2, which is a high-voltage PMOS transistor having a structure complementary to high-voltage NMOS transistors such as those described in my earlier patents, is to operate from the high side at a high positive voltage, with the source electrode 42 connected to a high positive voltage, typically about 700 volts. In the reverse blocking or off state the substrate and drain are at ground potential, while the source and gate are at the power supply voltage of about 700 volts. In this state, the high voltage between the source and drain is supported laterally by a junction 56 between the drain and the drift region, while the linkup region 36 is not connected to any electrode and floats up to the high-voltage potential of the surrounding regions, which are at the supply voltage. Since there is no path for current flow, the junctions between the linkup region and the surrounding regions (30, 51) of opposite conductivity type will not break down.

In the on state, the substrate is at ground potential, the source is at the supply voltage of about 700 volts, the gate is approximately 12 volts below the supply voltage (about 688 volts) and the drain is approximately one volt below the supply voltage, or about 699 volts. In this state, the negative gate-to-source voltage (−12 volts) induces a top inversion channel in the channel region 30 below the gate electrode 38 which connects the p-type linkup region to the p-type source region. Furthermore, the positive source-to-substrate voltage and drain-to-substrate voltage together induce a back inversion channel at the bottom of the drift region 32 and buffer region 51. This inversion channel connects the linkup region to the drain region and thus provides a continuous path for holes to flow from the source region to the drain region when the device is in the on state.

In this manner, the present invention provides a high-voltage PMOS transistor capable of blocking a high positive voltage with respect to the substrate while permitting the flexible implementation of both NMOS and PMOS high-voltage transistors having approximately equal breakdown voltages using a single (typically NMOS) technology.

While the invention has been particularly shown and described with reference to several preferred embodiments thereof, it will be understood by those skilled in the art that various changes in form and detail may be made without departing from the spirit or scope of the invention. Thus, for example, an NMOS device could be fabricated in PMOS technology using the present invention by reversing the conductivity types of all doped semiconductor regions.

What is claimed is:

1. A Semiconductor-On-Insulator (SOI) device comprising a semiconductor substrate, a buried insulating layer on said substrate, and a lateral MOSFET on said buried insulating layer, said MOSFET comprising a semiconductor surface layer on said buried insulating layer and having a source region of a first conductivity type, a channel region of a second conductivity type opposite to that of the first, an insulated gate electrode over said channel region and insulated therefrom, a lateral drift region of said second conductivity type, and a drain region of said first conductivity type and laterally spaced apart from said channel region by said drift region, characterized in that a semiconductor linkup region of said first conductivity type is provided between said channel region and said drift region and extends substantially through said semiconductor surface layer, and in that said source region is electrically coupled to said drift region.

2. An SOI device as in claim 1, wherein said first conductivity type is p type and said second conductivity type is n type.

3. An SOI device as in claim 1, wherein said first conductivity type is n type and said second conductivity type is p type.

4. An SOI device as in claim 1, wherein said linkup region extends from an upper surface of said semiconductor surface layer down to said buried insulating layer.

5. An SOI device as in claim 1, characterized in that at least a part of said lateral drift region between said linkup region and said drain region is thinner than a remaining part of said semiconductor surface layer.

6. An SOI device as in claim 1, characterized in that a surface insulating layer is provided on said drift region, and in that a conductive field plate is provided on said surface insulating layer and over at least a part of said drift region, said conductive field plate being electrically coupled to said drain region.

7. An SOI device as in claim 1, characterized in that a buffer region of said second conductivity type and having a higher doping concentration than that of said drift region is provided between said linkup region and said drift region.

8. An SOI device as in claim 1, characterized in that said linkup region comprises a surface region of said first conductivity type and having a higher doping concentration than that of a remaining part of said linkup region.

* * * * *